United States Patent
Jany et al.

(10) Patent No.: US 10,790,839 B2
(45) Date of Patent: Sep. 29, 2020

(54) DEVICE FOR ADJUSTING THE LOCKING OF AN INJECTION LOCKED FREQUENCY MULTIPLIER

(71) Applicant: COMMISSARIAT A L'ENERGIE ATOMIQUE ET AUX ENERGIES ALTERNATIVES, Paris (FR)

(72) Inventors: Clement Jany, Grenoble (FR); Jose-Luis Gonzalez Jimenez, Grenoble (FR); Frederic Hameau, Grenoble (FR); Alexandre Siligaris, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/570,549

(22) Filed: Sep. 13, 2019

(65) Prior Publication Data

US 2020/0091922 A1    Mar. 19, 2020

(30) Foreign Application Priority Data

Sep. 14, 2018   (FR) ..................................... 18 58325

(51) Int. Cl.
*H03L 7/24* (2006.01)
*H03L 7/06* (2006.01)

(52) U.S. Cl.
CPC . *H03L 7/24* (2013.01); *H03L 7/06* (2013.01)

(58) Field of Classification Search
CPC ..... H03L 7/24; H03L 7/06; H03L 7/07; H03L 7/08; H03L 7/0802–0898; H03L 7/20; H03L 7/22; H03L 7/23
See application file for complete search history.

(56) References Cited

U.S. PATENT DOCUMENTS 5,339,049 A * 8/1994 Bradley ................. H03L 7/113
                                                            331/1 A
9,209,748 B2 * 12/2015 Siligaris .................... H03L 7/18
(Continued)

FOREIGN PATENT DOCUMENTS

CA          2 395 891 A1    2/2004
WO    WO 2013/079685 A1    6/2013

OTHER PUBLICATIONS

Chenggang Yan et aL, "A 370pW Ring VCO Based Injection-Locked Frequency Synthesizer for GPS Receiver", 2018 3rd International Conference on Computer and Communication Systems, IEEE, Apr. 27, 2018, pp. 387-391. (Year: 2018).*
(Continued)

*Primary Examiner* — Patrick C Chen
(74) *Attorney, Agent, or Firm* — Oblon, McClelland, Maier & Neustadt, L.L.P.

(57) ABSTRACT

Device for adjusting the locking of an injection locked frequency multiplier, including:
    a first input receiving a first signal of frequency f1, and a second input receiving a second signal of frequency f2 outputted by the frequency multiplier;
    a sub-sampler of the second signal;
    a control circuit configured for:
       receiving a third signal corresponding to the second signal sub-sampled by the first signal or by another multiple signal of frequency of f1, then
       carrying out a high-pass or band-pass filtering of the third signal;
       determining that the frequency multiplier is locked on a multiple of f1 when the signal obtained after filtering is substantially zero, then
       outputting a signal the value of which is representative of the locking or not of the frequency multiplier.

11 Claims, 5 Drawing Sheets

(56) References Cited

U.S. PATENT DOCUMENTS

| | | | | |
|---|---|---|---|---|
| 2009/0115534 A1* | 5/2009 | Imenes | ................... | H03L 7/091 331/17 |
| 2016/0028495 A1* | 1/2016 | Jany | ....................... | H04B 15/04 375/219 |

OTHER PUBLICATIONS

Seyeon Yoo et al., "A PVT-Robust—39dBc 1kHz-to-100MHz Integrated—Phase-Noise 29GHz Injection-Locked Frequency Multiplier with a 600pW Frequency-Tracking Loop Using the Averages of Phase Deviations for mm-Band 5G Transceivers", 2017 ISSCC, IEEE, Feb. 5, 2017, 3 pages (Year: 2017).*

Sung-Yong Cho et al., "A 2.5-5.6 GHz Subharmonically Injection-Locked All-Digital PLL With Dual-Edge Complementary Switched Injection", IEEE Transactions on Circuits and Systems-I: Regular Papers, vol. 65, No. 9, Sep. 2018, 12 pages (Year: 2018).*

U.S. Appl. No. 16/227,913, filed Dec. 20, 2018, 2019/0199399 A1, Vo, T.,et al.

U.S. Appl. No. 16/531,877, filed Aug. 5, 2019, Siligaris, A, et al.

French Preliminary Search Report dated Jul. 11, 2019 in French Application 18 58325, filed Sep. 14, 2018 (with English Translation of Categories of Cited Documents).

Chenggang Yan et al., "A 370 µW Ring VCO Based Injection-Locked Frequency Synthesizer for GPS Receiver", 2018 3rd International Conference on Computer and Communication Systems, IEEE, Apr. 27, 2018, pp. 387-391.

Seyeon Yoo et al., "A PVT-Robust—39dBc 1kHz-to-100MHz Integrated—Phase-Noise 29GHz Injection-Locked Frequency Multiplier with a 600 µW Frequency-Tracking Loop Using the Averages of Phase Deviations for mm-Band 5G Transceivers", 2017 ISSCC, IEEE, Feb. 5, 2017, 3 pages.

Sung-Yong Cho et al., "A 2.5-5.6 GHz Subharmonically Injection-Locked All-Digital PLL With Dual-Edge Complementary Switched Injection", IEEE Transactions on Circuits and Systems-I: Regular Papers, vol. 65, No. 9, Sep. 2018, 12 pages.

Clement Jany et al., "A novel ultra-low phase noise, programmable frequency multiplier-by-30 architecture. Application to 60-GHz frequency generation", 2013 Proceedings of the ESSCIRC, IEEE, Sep. 22, 2014, pp. 427-430.

Teerachot Siriburanon et al., "A 2.2 GHz—242 dB-FOM 4.2 mW ADC-PLL Using Digital Sub-Sampling Architecture", IEEE Journal of Solid-State Circuits, vol. 51, No. 6, Jun. 2016, pp. 1385-1397.

Seyeon Yoo et al., "A Low-Integrated-Phase-Noise 27-30-GHz Injection-Locked Frequency Multiplier With an Ultra-Low-Power Frequency-Tracking Loop for mm-Wave-Band 5G Transceivers", IEEE Journal of Solid State Circuits, vol. 53, No. 2, Feb. 2018, 14 pages.

* cited by examiner

DEVICE FOR ADJUSTING THE LOCKING OF AN INJECTION LOCKED FREQUENCY MULTIPLIER

TECHNICAL FIELD AND PRIOR ART

The technical field of the invention is that of injection locked frequency multiplier devices, used for example for transmitting and/or receiving signals, for example, in the radio-frequency (RF) field. The invention notably applies to systems for transmitting and/or receiving signals wherein a frequency synthesis is carried out.

An "Injection-Locked Oscillator" or ILO is an oscillator that, in the absence of injection signal applied as input, generates as output a signal at a specific oscillation frequency, known as self-oscillation frequency, which depends notably on the value of a control signal, known as $V_{tune}$, applied to a control input of the ILO. When an injection signal is applied as input of the ILO and when said signal verifies certain conditions, such as for example, having a frequency of a value close to same of the self-oscillation frequency and a sufficient amplitude level, the ILO is locked on the frequency of the injection signal, or a multiple of said frequency so that the oscillation frequency thereof is dependent on the frequency on which the ILO is locked. The ILO copies the phase properties of the injection signal, notably the phase noise.

The use of such an ILO makes it possible to use a "Phase-Locked Loop" or PLL to generate a frequency-stabilised signal. In addition, the ILO may be used to form an ILFM (Injection Locked Frequency Multiplier) or an ILFD (Injection-Locked Frequency Divider).

The document "A programmable Frequency Multiplier-by-29 Architecture for Millimeter Wave Applications" by C. Jany et al., IEEE Journal of Solid-State Circuits, no. 99, pp. 1-11, July 2015, describes a frequency synthesis device that, in order to generate a high-frequency signal, carries out a multiplication between a lower signal of frequency and a complex periodic signal centred at higher frequency, then carries out, from the result of said frequency multiplication, a frequency recovery in order to obtain the desired high-frequency signal. The frequency recovery is, for example, carried out by an ILO.

The injection locking which is carried out notably depends on the characteristics of the injection signal applied as input of the ILO that forces the value of the frequency at which the ILO oscillates. The injection signal must verify certain conditions to guarantee the locking of the ILO, notably different power levels according to the difference between the frequency of the injection signal and the self-oscillation frequency of the ILO. For a given power level of the injection signal, it is possible to define the locking range of the ILO as being the range of frequencies of the injection signal (or one of the multiples thereof or dividers in the case of the ILFM or ILFD, respectively) that is situated around the value of the self-oscillation frequency of the ILO and for which the injection locking is obtained.

However, variations of certain characteristics of the ILO may change the value of the self-oscillation frequency of the ILO relative to the nominal value thereof, and in this case offset the locking range relative to the nominal frequency of the injection signal. In order to guarantee the injection locking of the ILO at the desired frequency, various adjustment techniques may be used to change the self-oscillation frequency and recentre the locking range on the nominal frequency of the injection signal. Said techniques need to determine whether the ILO is indeed locked or not on the injection signal that is applied thereto as input. For this, a plurality of solutions exist.

For example, it is possible to extract with a mixer, the difference between the frequency of the injection signal, or a multiple or a divider of said frequency, and the self-oscillation frequency of the ILO. Said information may therefore be used to adjust the self-oscillation frequency of the ILO and thus reduce said difference to zero (in the best case) or to a value guaranteeing at least that the injection signal is situated in the locking range of the ILO. Such a solution is, for example, described in the document "A Sub-Harmonic Injection-Locked Quadrature Frequency Synthesizer with Frequency Calibration Scheme for Millimeter-Wave TDD Transceivers" by W. Deng and al., IEEE J. Solid-State Circuits, vol. 48 no. 7, pp. 1710-1720, July 2013. It is also possible to use an envelope detector to extract the information relating to the difference between the frequency of the injection signal, or a multiple or a divider of said frequency, and the self-oscillation frequency of the ILO. The documents "A Mixed-Mode Injection Frequency-Locked Loop for Self-Calibration of Injection Locking Range and Phase Noise in 0.13 µm CMOS" by Dongseok Shin et al., ISSCC 2016, pp. 50-51, and "A Low-Integrated-Phase-Noise 27-30-GHz Injection-Locked Frequency Multiplier With an Ultra-Low-Power Frequency-Tracking Loop for mm-Wave-Band 5G Transceivers" by Seyeon Yoo et al, IEEE Journal of Solid-State Circuits, Vol. 53, No. 2, February 2018, describe such a technique.

Whether the difference between the frequency of the injection signal, or a multiple or a divider of said frequency, and the self-oscillation frequency of the ILO is obtained using a mixer or an envelope detector, said two devices operate at high frequency, that is to say at the frequency of the output signal of the ILO that forms part, for example, of the mmW band, or millimetre-wave frequency band. Yet, this involves a significant consumption of power of said devices. In addition, such techniques are not suitable in the case of ILFM when the frequency multiplication factor between same of the injection signal and same of the output signal of the ILO is high, for example greater than 3.

Another technique for ensuring the locking of the ILO while reducing the frequency error between the ILO and the signal injection applied as input consists of controlling the ILO in a PLL type loop including a phase comparator ("Phase Frequency Detector", or PFD) or a frequency comparator ("Frequency Detector", FD). However, said solution poses the same problem as that encountered with a mixer or an envelope detector operating at high frequency, i.e. a significant energy consumption.

Another technique consists of managing the delay within an ILO produced in the form of a ring oscillator, for example with delay cells. However, said technique does not work for high-frequency applications.

DESCRIPTION OF THE INVENTION

Therefore, there is a need for proposing a device for adjusting the locking of an injection locked frequency multiplier that does not have the drawbacks of the prior art previously disclosed, that is to say that does not consume a lot of energy, can be used for high-frequency signals and when the frequency multiplication factor is high.

For this, it is proposed an adjustment device configured for adjusting the locking of an injection locked frequency multiplier, comprising at least:

one first input configured for receiving a first signal of frequency f1 intended to be applied as input of the injection locked frequency multiplier, and a second input configured for receiving a second signal of frequency f2 intended to be outputted by the injection locked frequency multiplier;

one sub-sampler configured for carrying out a sub-sampling of the second signal by the first signal;

one control circuit configured for:
receiving as input a third signal obtained as output of the sub-sampler and corresponding to the second signal sub-sampled by the first signal, then determining that the injection locked frequency multiplier is locked on a frequency equal to a multiple of the frequency f1 when the third signal is continuous and when the injection locked frequency multiplier is not locked on a frequency equal to a multiple of the frequency f1 when the third signal varies over time, then outputting a fourth signal the value of which is representative of the locking or not of the injection locked frequency multiplier on a frequency corresponding to a multiple of the frequency f1.

It is further proposed an adjustment device configured for adjusting the locking of an injection locked frequency multiplier, including at least:

one first input configured for receiving a first signal of frequency f1 intended to be applied as input of the injection locked frequency multiplier, and a second input configured for receiving a second signal of frequency f2 intended to be outputted by the injection locked frequency multiplier;

one sub-sampler configured for carrying out a sub-sampling of the second signal by the first signal or by another signal of frequency $f_S$ equal to an integer multiple of the frequency f1 and less than the frequency f2;

one control circuit configured for:
receiving as input a third signal obtained as output of the sub-sampler and corresponding to the second signal sub-sampled by the first signal or by the signal of frequency $f_s$, then determining that the injection locked frequency multiplier is locked on a frequency equal to a multiple of the frequency f1 when the third signal is continuous and when the injection locked frequency multiplier is not locked on a frequency equal to a multiple of the frequency f1 when the third signal varies over time, then outputting a fourth signal the value of which is representative of the locking or not of the injection locked frequency multiplier on a frequency corresponding to a multiple of the frequency f1;

and wherein the control circuit comprises an integrator filter configured for carrying out a high-pass or pass-band filtering of the third signal, the injection locked frequency multiplier being considered as locked on a frequency corresponding to a multiple of the frequency f1 when the signal obtained by said high-pass or pass-band filtering is substantially zero.

Said device proposes an alternative solution simplifying the generation of a signal (the fourth signal) containing information about the frequency difference between the input and the output of the frequency multiplier, via a process that consumes little energy. Said device notably does not use a frequency divider operating at high frequency that is a significant source of energy consumption.

Said device is much more suitable for operating with a frequency multiplier applying a significant multiplication factor between the frequency of the input signal and same of the output signal, for example, greater than 3, thanks to the sub-sampling which is carried out.

Said device may advantageously form part of a low phase noise and low consumption frequency synthesis device.

Before the locking of the frequency multiplier is adjusted, the value of the frequency f2 may be close or equal to same of a multiplier of the frequency f1.

A signal is said to be "continuous" when the value of the amplitude thereof is substantially constant over time, that is to say independent of time.

A signal is said to be "varying over time" when the value of the amplitude thereof changes over time, that is to say is not substantially constant over time.

For example, the control circuit may be configured for determining that the injection locked frequency multiplier is not locked on a frequency corresponding to a multiple of the frequency f1 when the third signal is periodic. A signal is said to be "periodic" if the variations of the amplitude thereof are reproduced regularly after a constant period T.

In the frequency range, the power of a "continuous" signal is only situated at the zero frequency, that is to say only the continuous component, or DC, has a power that is not zero. A signal said to be "varying over time" or "periodic" comprises power at frequencies other than the zero frequency. Said difference in distribution of the power between a continuous signal and a signal varying over time may therefore be used to determine whether the injection locked frequency multiplier is locked or not on a frequency corresponding to a multiple of the frequency f1.

The fact that the value of the fourth signal is representative of the locking or not of the injection locked frequency multiplier on a frequency corresponding to a multiple of the frequency f1 means that it is possible to determine, from said value, whether the injection locked frequency multiplier is locked or not on a frequency corresponding to a multiple of the frequency f1.

For example, the control circuit may be configured to output a fourth signal the amplitude of which has a first value when the injection locked frequency multiplier is locked on a frequency corresponding to a multiple of the frequency f1, and a second value, different from the first value, when the injection locked frequency multiplier is not locked on a frequency corresponding to a multiple of the frequency f1. The fourth signal may in this case correspond to a signal providing information about the status of the locking or not of the frequency multiplier on a frequency corresponding to a multiple of the frequency f1. Thus, the adjustment device may be used as analysis device, or information device, of the locking of an injection locked frequency multiplier.

Alternatively, the fourth signal may be used within a feedback loop in order to be used as feedback signal and cause the frequency multiplier to be locked at a multiple of the frequency f1. In this case, the information that the injection locked frequency multiplier is locked on a frequency corresponding to a multiple of the frequency f1 may be deduced due to the fact that the value of the amplitude of the fourth signal remains stable over time, and the information that the injection locked frequency multiplier is not locked on a frequency corresponding to a multiple of the frequency f1 may be deduced due to the fact that the value of the amplitude of the fourth signal is not constant over time, indicating that the adjustment device is still in an iterative adjustment phase of the locking of the frequency multiplier.

Advantageously, the output of the control circuit may be configured for being connected to a control input of the injection locked frequency multiplier, the device being able to be configured for forming a feedback loop for the locking of the injection locked frequency multiplier on a frequency corresponding to a multiple of the frequency f1. The output signal of the control circuit may notably be used for changing the self-oscillation frequency of the frequency multiplier.

The control circuit comprises an integrator filter configured for carrying out a high-pass or pass-band filtering of the third signal, the injection locked frequency multiplier being able to be considered as locked on a frequency corresponding to a multiple of the frequency f1 when the signal obtained by said high-pass or pass-band filtering is substantially zero. The value of the low cut-off frequency of the integrator filter may depend on a characteristic of the injection signal received by the integrator filter (that is to say the third signal), for example on the phase noise of the injection signal. By way of example, the low cut-off frequency of the integrator filter may correspond to the "offset" frequency below which the phase noise of the injection signal is mostly (for example, at least 50%) contained. For example, for an injection signal wherein at least 66%, of the phase noise is contained within a frequency range said to be "offset" ranging up to an "offset" frequency value equal to approximately 100 kHz, the low cut-off frequency of the integrator filter may be equal to approximately 100 kHz.

The integrator filter may be configured for carrying out a pass-band filtering of the third signal with a high cut-off frequency equal to approximately (f1)/2.

The control circuit may further comprise a comparator configured for comparing an output signal of the integrator filter with a threshold value, and a control system configured for changing or not at least one parameter of the injection locked frequency multiplier according to a value of an output signal of the comparator.

It is also proposed a frequency multiplication device, including at least:
one injection locked frequency multiplier;
one adjustment device such as defined above, the second input of which is coupled to an output of the injection locked frequency multiplier.

The device for adjusting the locking of the injection locked frequency multiplier may advantageously be used when the multiplication factor of the injection locked frequency multiplier is high, for example, when the value of the f2/f1 ratio is between approximately 20 and 35, or between approximately 10 and 35.

An injection input of the injection locked frequency multiplier may be configured for receiving the first signal.

The injection locked frequency multiplier may comprise at least one injection-locked oscillator, ILO.

In a first embodiment, the ILO may ensure alone the function of frequency multiplication of the injection locked frequency multiplier, and thus alone form an ILFM. In this case, an injection input of the ILO may be configured to receive the first signal.

In a second embodiment, the injection locked frequency multiplier may further comprise a periodically repeated oscillation train generator configured for receiving as input the first signal and for generating as output a fifth signal corresponding to a oscillations train of frequency substantially equal to N·f1, of duration less than T1=1/f1 and repeated periodically at the frequency f1, with N integer number greater than 1, and the output of which is coupled to the input of the ILO.

Furthermore, the device may be such that:
a control input of the ILO is coupled to the output of the control circuit;
the control circuit is configured for changing the value of the fourth signal until the injection locked frequency multiplier is locked on a frequency corresponding to a multiple of the frequency f1.

The adjustment device forms in this case a feedback loop wherein is situated the injection locked frequency multiplier.

It is also proposed a method for adjusting the locking of an injection locked frequency multiplier, including at least:
generation, by the injection locked frequency multiplier and from a first signal of frequency f1, of a second signal of frequency f2;
generation of a third signal corresponding to the second signal sub-sampled by the first signal;
determination that the injection locked frequency multiplier is locked on a frequency equal to a multiple of the frequency f1 when the third signal is continuous and when the injection locked frequency multiplier is not locked on a frequency equal to a multiple of the frequency f1 when the third signal varies over time;
generation of a fourth signal the value of which is representative of the locking or not of the injection locked frequency multiplier on a frequency corresponding to a multiple of the frequency f1.

Lastly it is also proposed a method for adjusting the locking of an injection locked frequency multiplier, including at least:
generation, by the injection locked frequency multiplier and from a first signal of frequency f1, of a second signal of frequency f2;
generation of a third signal corresponding to the second signal sub-sampled by the first signal or by another signal of frequency $f_s$ equal to an integer multiple of the frequency f1 and less than the frequency f2;
high-pass or pass-band filtering of the third signal;
determination that the injection locked frequency multiplier is locked on a frequency equal to a multiple of the frequency f1 when the signal obtained by said high-pass or pass-band filtering is substantially zero;
generation of a fourth signal the value of which is representative of the locking or not of the injection locked frequency multiplier on a frequency corresponding to a multiple of the frequency f1.

BRIEF DESCRIPTION OF THE DRAWINGS

The present invention will be better understood upon reading the description of examples of embodiments given, purely by way of indicative and non-limiting example, while referring to the appended drawings wherein.

Identical, similar or equivalent portions of the various figures described hereafter bear the same numerical references such as to facilitate the change from one figure to the other.

The various portions shown in the figures are not necessarily according to a uniform scale, in order to make the figures more readable.

The various possibilities (alternatives and embodiments) must be understood as not being exclusive from one another and may be mutually combined.

DETAILED DESCRIPTION OF SPECIFIC EMBODIMENTS

Figure 1:
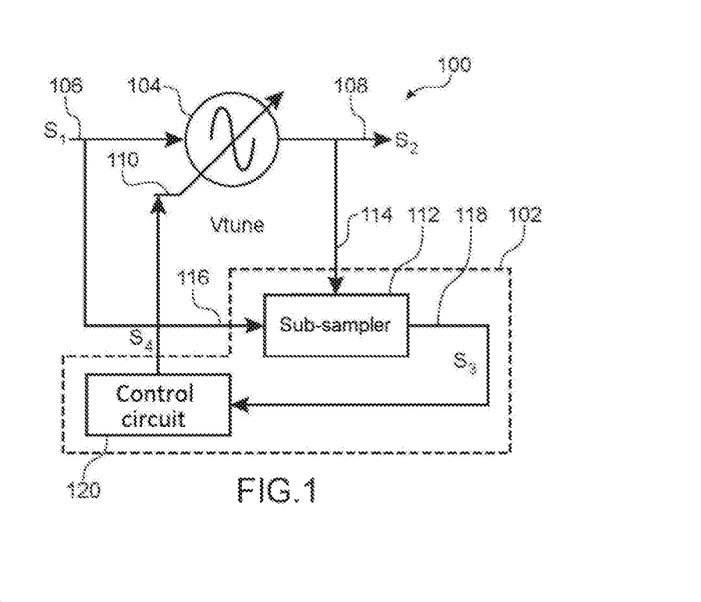
FIG. 1 shows a frequency multiplication device including a device for adjusting the injection locking of a frequency multiplier, according to a first embodiment.

First of all, reference is made to FIG. 1 that schematically shows a frequency multiplication device 100 including a device 102 for adjusting the injection locking of a frequency multiplier of the device 100, according to a first embodiment.

In said first embodiment, the injection locked frequency multiplier of the device 100 corresponds to an injection-locked oscillator, or ILO, 104. Said ILO 104 corresponds to an ILFM.

An input 106 of the device 100 is connected to an injection input of the ILO 104. A first signal S1 of frequency f1 is applied to said input 106. The first signal S1 corresponds, for example, to a sinusoidal signal or a square-wave signal. Said frequency f1 corresponds to the frequency intended to be multiplied by the device 100.

An output 108 of the device 100 corresponds to the output of the ILO 104. A second signal S2 of frequency f2=N·f1 is intended to be obtained on said output 108, with N integer number greater than 1 when the ILO 104 is locked correctly on said frequency. When the ILO 104 is not locked correctly on said frequency that corresponds to a multiple of the frequency f1, the signal obtained as output of the ILO 104 may have a complex spectrum, centred around the self-oscillation frequency thereof, or may have a single spectrum composed only of its own self-oscillation frequency that does not correspond to a multiple of f1.

The ILO 104 also comprises a control input 110 to which a control signal $V_{tune}$ is applied in order to change the self-oscillation frequency thereof.

The first signal S1 corresponds to the signal injection and the ILO 104 is intended to be locked on a frequency of value equal to a multiple of the frequency f1. Said first signal S1 is, for example, generated by a quartz generator or even by a PLL, not shown in FIG. 1.

In the absence of injection signal, the ILO 104 outputs a sinusoidal signal of oscillation said to be "free" and the frequency of which is equal to the self-oscillation frequency $f_{self\_osc\_104}$ thereof, the value of which depends on the value of the control signal $V_{tune}$ applied to the control input 110 thereof. When the value of the control signal $V_{tune}$ is chosen correctly, the value of the frequency $f_{self\_osc\_104}$ is of the same order of magnitude as same of the desired frequency f2 ($f_{self\_osc\_104} \approx f2$). When the ILO 104 receives the first signal S1 on the injection input thereof, same must ideally be locked on the frequency corresponding to the multiple of the frequency f1 that is the closest to the frequency $f_{self\_osc\_104}$. However, an adjustment of the value of the control signal $V_{tune}$ is nearly always necessary to obtain said locking. Said adjustment of the control value is carried out by the device 102 for adjusting the injection locking of the ILO 104.

The device 102 comprises a sub-sampler 112 configured for carrying out a sub-sampling of the signal S2, which is applied to an input 114 of the device 102, at the frequency f1 of the signal S1, which is applied to another input 116 of the device 102. The sub-sampler 112 outputs on an output 118 a signal S3 corresponding to the signal S2 sub-sampled by the signal S1 of frequency f1.

Alternatively, the sub-sampler 112 may be configured for carrying out a sub-sampling of the signal S2 at a frequency $f_S$ equal to an integer multiple of the frequency f1 and less than the frequency f2. In this case, the signal S3 outputted by the sub-sampler 112 corresponds to the signal S2 sub-sampled at the frequency $f_S$.

The device 102 also comprises a control circuit 120 receiving as input the signal S3 from which same determines whether the ILO 104 is locked or not on a multiple of the frequency f1.

Figure 2:
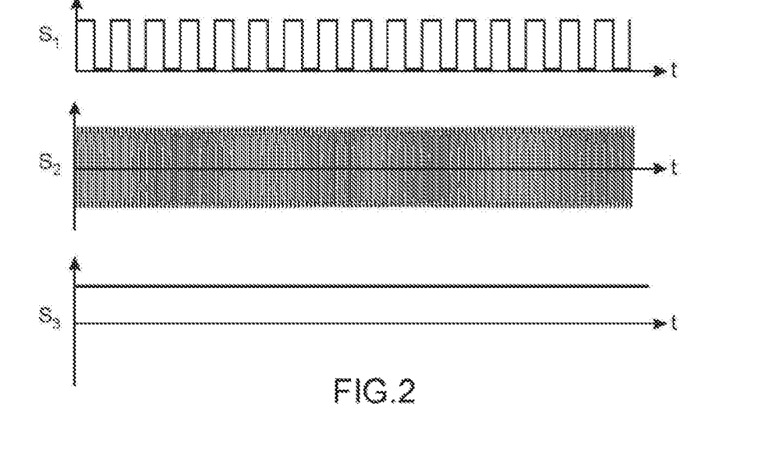
FIG. 2 shows the signals obtained in the frequency multiplication device according to a first embodiment when the injection locked frequency multiplier is locked on a multiple of the frequency of the injection signal that is applied thereto as input.

Indeed, when the ILO 104 is locked on a multiple of the frequency f1, the frequency f2 of the signal S2 then corresponds to said multiple of the frequency f1 of the signal S1. The signal S3 obtained on the output 118 of the sub-sampler 112 corresponds in this case to a continuous signal. FIG. 2 shows examples of signals S1, S2 and S3 obtained in such a configuration.

Figure 3:
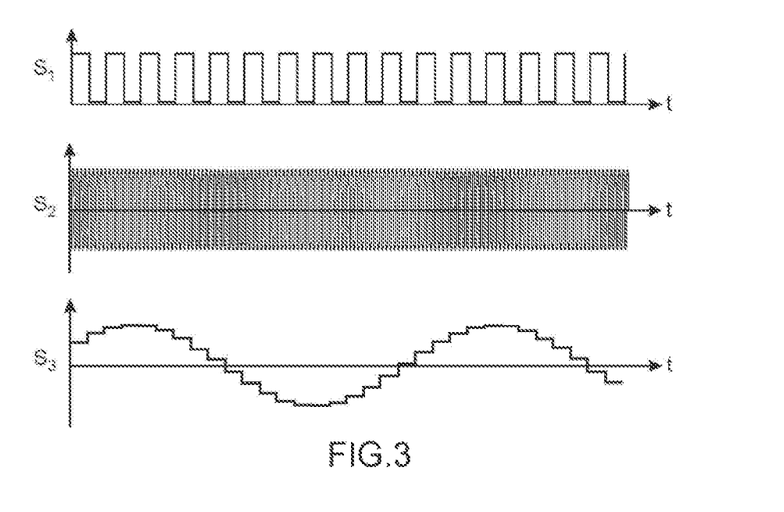
FIG. 3 shows the signals obtained in the frequency multiplication device according to a first embodiment when the injection locked frequency multiplier is not locked on a multiple of the frequency of the injection signal that is applied thereto as input.

By contrast, when the ILO 104 is not locked on a multiple of the frequency f1, the frequency f2 of the signal S2 does not correspond to said multiple of the frequency f1 of the signal S1. The signal S3 obtained on the output 118 of the sub-sampler 112 corresponds in this case to a signal that varies over time. The signal S3 may correspond to a periodic signal the main frequency of which corresponds to the difference between $f_{self\_osc\_104}$ and the multiple of f1 the closest to $f_{self\_osc\_104}$, or may correspond to a signal varying over time with a significant spectral content beyond the zero frequency. FIG. 3 shows examples of signals S1, S2 and S3 obtained in such a configuration. Furthermore, on the example in FIG. 3, the signal S3 is obtained by carrying out a sub-sampling of the signal S2 by a signal of frequency $f_S$ equal to an integer multiple of the frequency f1 and less than the frequency f2, and more specifically of frequency fS=2·f1 on the example in FIG. 3.

Thus, the control circuit 120 determines, from the continuous or variable over time character of the signal S3, whether the ILO 104 is locked or not on a multiple of the frequency f1 and outputs a fourth signal S4 the value of which is representative of the locking or not of the ILO 104 on said multiple of the frequency f1.

Figure 4:
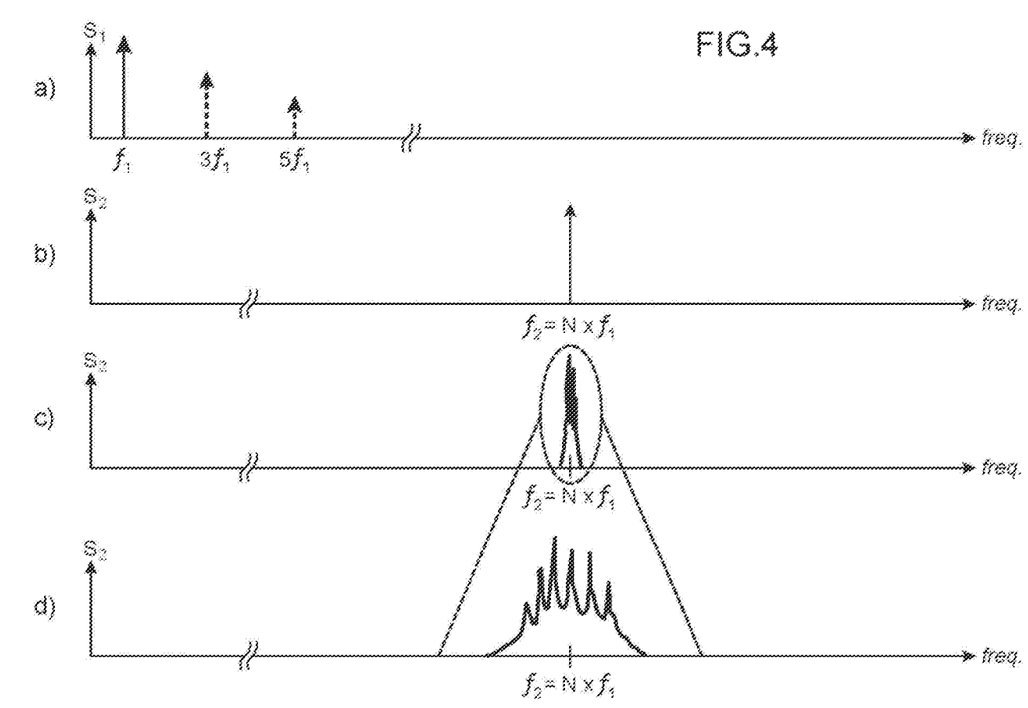
FIGS. 4 and 5 show the spectra of signals obtained in a frequency multiplication device including a device for adjusting the injection locking of a frequency multiplier.

FIG. 4 shows the spectra of signals S1 and S2 obtained in the device 100. As this is visible on the spectrum referenced a) in FIG. 4, the signal S1 comprises a main line (of greater amplitude) at the frequency f1 (fundamental frequency). When the signal S1 corresponds to a sinusoidal signal, said main line is the only one in the entire spectrum of the signal S1. When the signal S1 corresponds to a square-wave signal, the spectrum thereof also comprises other lines that correspond to the harmonics that are located at odd multiple frequencies of f1 (lines shown as dotted lines in FIG. 4).

The spectrum referenced b) in FIG. 4 corresponds to same of the signal S2 when the ILO 104 is locked on a multiple N of the frequency f1. The spectrum of said signal S2 corresponds to a Dirac δ function at the frequency f2=N·f1, and comprises a single line at the frequency f2 (although not visible in FIG. 2, said spectrum is symmetrical relative to the zero frequency and therefore also comprises a line at the frequency−f2). The spectrum of said signal S2 may be written by the following relation:

$$S2(f)=A_0\delta(f-f2)+A_0\delta(f+f2)=A_0\delta(f-N\cdot f_1)+A_0\delta(f+N\cdot f_1)$$

The spectrum referenced c) corresponds to same of the signal S2 when the ILO 104 is not locked on the multiple N of the frequency f1, and the spectrum referenced d) corresponds to an enlarged view around the frequency f2 of the spectrum referenced c). Said spectrum is made of a multitude of lines, or peaks, around the self-oscillation frequency of the ILO 104 that is close to the frequency f2. Said set of lines may be noted $S_{NL}(f)$, and the spectrum of the signal S2 may in this case be written by the following relation:

$$S2(f) = S_{NL}(f) * \left[\frac{1}{2}\delta(f-f_2) + \frac{1}{2}\delta(f+f_2)\right] =$$
$$\frac{1}{2}S_{NL}(f - N\cdot f_1) + \frac{1}{2}S_{NL}(F + N\cdot f_1)$$

The spectrum of the signal obtained as output of the sub-sampler 112 is made of frequency components of the signal applied as input of the sub-sampler 112 that are repeated at multiples of the sampling frequency, that is to say corresponds to the product of convolution of the spectrum of the input signal of the sub-sampler 112 with the Dirac δ functions that represent the sampling signal in the frequency range. Thus, by calling $S_{input}(f)$ the spectrum of the signal applied as input of the sub-sampler 112, $f_{sam}$ the sampling frequency and ci the Fourier coefficients of the sampling signal, with $|c_i|=|c-i|$, the spectrum of the signal $S_{sub\_sam}$ obtained as output of the sub-sampler 112 may be written with the following relation:

$$S_{sub-sam}(f) = S_{input}(f) * \sum_{k=0}^{\infty} c_k\delta(f - kf_{sam}) + c_{-k}\delta(f + kf_{sam})$$
$$\Big] = c_0 S_{input}(f) + c_1 S_{input}(f - f_{sam}) + c_{-1} S_{input}(f + f_{sam}) +$$
$$c_2 S_{input}(f - 2f_{sam}) + c_{-2} S_{input}(f + 2f_{sam}) + \text{terms at higher frequencies}$$

If the bandwidth, that is to say the spectral width, of the input signal is greater than the sampling frequency $f_{sam}$, the spectral components of the signal obtained as output of the sub-sampler 112 at the frequencies $\pm f_{sam}$ and $\pm 2\cdot f_{sam}$ overlap and produce the folding, or aliasing. By contrast, if the bandwidth of the input signal is less than the sampling frequency $f_{sam}$, said folding effect is not obtained. Indeed, if $S_{input}(f)$ has a narrow band centred around the frequency f2 with f2>$f_{sam}$, the folding phenomenon can be avoided if the bandwidth of $S_{input}(f)$ is sufficiently narrow. Said technique is known as sub-sampling because the sampling frequency $f_{sam}$ is less than the central frequency of the input signal. In the configuration described here, said condition is met given that when the ILO 104 is locked on the frequency f2, the spectrum of the output signal of the ILO 104 comprises a single line centred at the frequency f2, and when the ILO 104 is not locked on the frequency f2, the spectrum of the output signal of the ILO 104 comprises a narrow band centred around the frequency f2.

When the ILO 104 is locked on the frequency f2, the spectrum of the signal S3 obtained as output of the sub-sampler 112 may be written such that:

$$S3(f) = [A_0\delta(f - N\cdot f_1) + A_0\delta(f + N\cdot f_1)] * \sum_{k=0}^{\infty} c_k\delta(f - kf_1) +$$
$$c_{-k}\delta(f + kf_1)$$
$$\Big] = c_0 2A_0 + c_1 A_0\delta(f - f_1) + c_{-1} A_0\delta(f + f_1) + \text{terms at higher frequencies}$$

In this case, at low frequencies (f<<f1), the spectrum of the signal S3 only comprises a single continuous component, the other components of said spectrum being located at frequencies corresponding to even multiples of the frequency f1.

When the ILO 104 is not locked on the frequency f2, the spectrum of the signal S3 obtained as output of the sub-sampler 112 may be written such that:

$$S3(f) = \left[\frac{1}{2}S_{NL}(f - N\cdot f_1) + \frac{1}{2}S_{NL}(f + N\cdot f_1)\right] * \sum_{k=0}^{\infty} c_k\delta(f - kf_1) +$$
$$c_{-k}\delta(f + kf_1)] =$$
$$c_0 S_{NL}\Big(S_{NL}(f - f_1) + c_{-1}\frac{1}{2}S_{NL}(f + f_1) + \text{terms at higher frequencies}$$

In this case, at low frequencies (f<<f1), the spectrum of the signal S3 comprises all of the lines noted $S_{NL}(f)$ being situated, in the signal S2, around the frequency f2 when the ILO 104 is not locked, and which is situated here centred around the zero frequency. Said assembly is situated at even multiples of the frequency f1.

Figure 5:
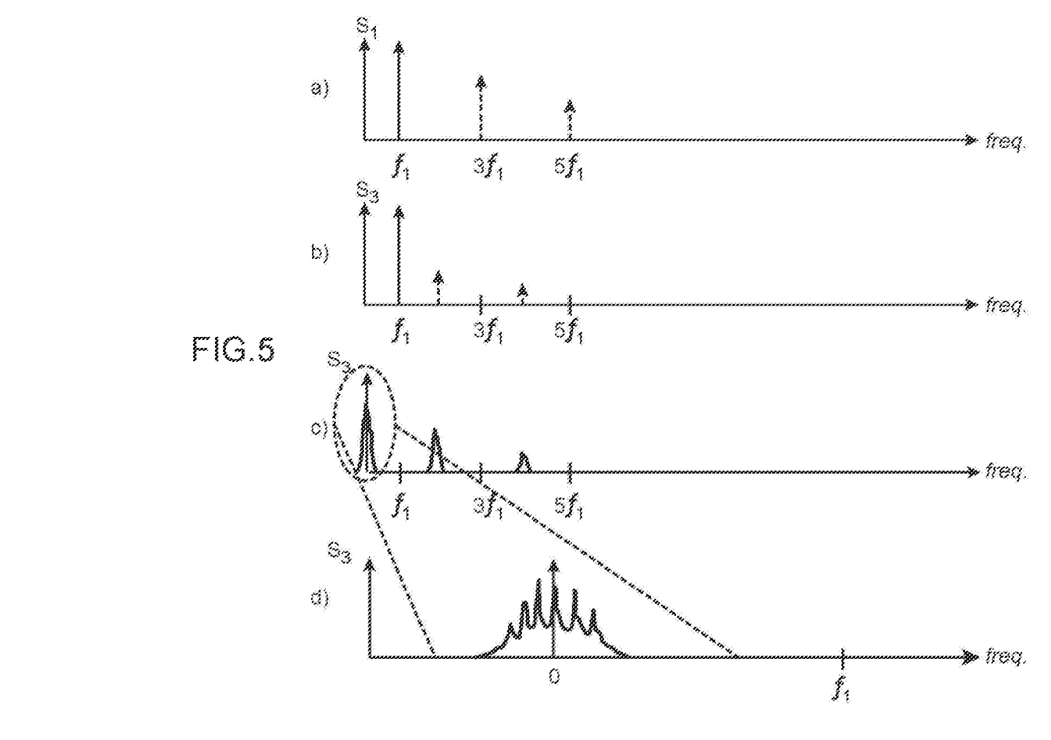

FIG. 5 shows the spectra of signals S1 and S3 in the device 100. The signal S1, the spectrum of which is referenced a), is similar to same the spectrum a) of which is shown in FIG. 4. The spectrum referenced b) in FIG. 5 corresponds to same of the signal S3 when the ILO 104 is locked on a multiple N of the frequency f1. The spectrum referenced c) corresponds to same of the signal S3 when the ILO 104 is not locked on the multiple N of the frequency f1, and the spectrum referenced d) corresponds to an enlarged view around the 0 frequency of the spectrum.

In the first embodiment described here, the device 102 is configured for forming a feedback loop leading to the locking of the ILO 104 on a multiple of the frequency f1. For this, the output of the control circuit 120 on which the signal S4 is outputted is connected to the control input 110 of the ILO 104, and the control circuit 120 is configured for changing the value of the signal S4, which corresponds to the adjustment signal applied as input of the ILO 104, until the ILO 104 is locked on the value of the multiple of f1 the closest to $f_{self\_osc\_104}$.

Advantageously, the device 100 is used when the value of the f2/f1 ratio sought is greater than 3 and, for example, between approximately 20 and 35. Indeed, with such a multiplication factor, an ILO is not easily locked on the frequency f1 of the injection signal that is applied thereto as input. The device 102 proposed here makes it possible to obtain said locking of the ILO 104 even with such a frequency multiplication factor.

By way of example, the ILO 104 may be produced as described in the document "A 50 GHz direct injection locked oscillator topology as low power frequency divider in 0.13 µm CMOS" by M. Tiebout, Solid-State Circuits Conference, 2003, ESSCIRC '03. Proceedings of the 29th European, pp. 73-76, 16-18 Sep. 2003.

By way of example, the sub-sampler 112 may correspond to a sample and hold type circuit.

In order to detect the locking or not of the ILO 104 on a multiple of the frequency f1, the control circuit 120 may advantageously be based on the fact that in the event of no locking, the spectrum of the signal S3 comprises the energy beyond the zero frequency. For this, the control circuit 120 may carry out a filtering in order to determine the energy contained in the signal beyond the 0 Hz frequency. This may be carried out with a high-pass filter, or more generally with a pass-band filter having a low cut-off frequency close to 0 Hz and a high cut-off frequency around f1/2. The use of a high cut-off frequency makes it possible to prevent higher frequency terms (greater than said high cut-off frequency) from impacting the determination of the energy of the signal S3 beyond the zero frequency. The low cut-off frequency is chosen sufficiently low in order to cover a sufficiently large range of configurations wherein the ILO 104 is not locked, even same very similar to the conditions for locking the ILO 104.

Figure 6:
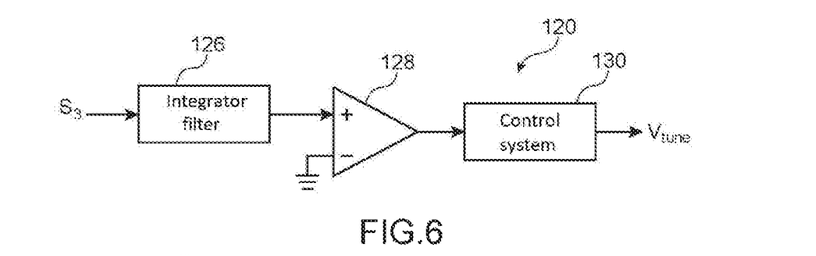
FIG. 6 shows an example of embodiment of a control circuit of a device for adjusting the injection locking of a frequency multiplier.

The control circuit 120 may be produced analogically and/or digitally. FIG. 6 schematically shows one example of embodiment of a control circuit 120.

The control circuit 120 comprises here an integrator filter 126 receiving as input the signal S3 and calculating, from the signal S3, the amount of energy between the low and high cut-off frequencies thereof (for example, between 0 and f1/2). If said amount of energy is zero, the ILO 104 is considered as being locked on a multiple of the frequency f1. In the opposite case, the ILO 104 is considered as not being locked on a multiple of the frequency f1.

Figure 7:
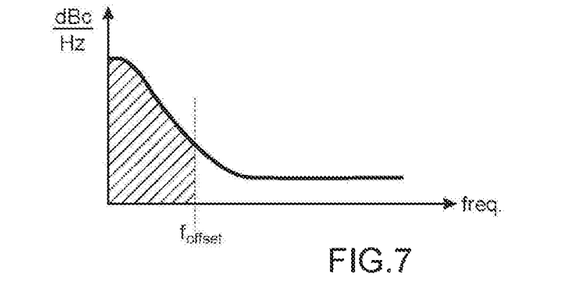
FIG. 7 shows the phase noise of the injection signal received by an integrator filter of a control circuit of a device for adjusting the injection locking of a frequency multiplier.

The integrator filter 126 is, for example, configured for carrying out a high-pass or pass-band filtering of the signal S3. When the integrator filter 126 carries out a pass-band filtering of the signal S3, the high cut-off frequency thereof is, for example, equal to (f1)/2. When the integrator filter 126 carries out a pass-band or high-pass filtering of the signal S3, the low cut-off frequency thereof may be equal to 0 or close to 0. Alternatively, the value of the low cut-off frequency of the integrator filter 126 may depend on a characteristic of the signal S3, for example, the phase noise thereof. By way of example, said low cut-off frequency may correspond to the "offset" frequency below which the phase noise of the injection signal is mostly (at least 50%) contained. FIG. 7 shows the phase noise, in dBc/Hz, of a signal corresponding, for example, to the signal S3. In said example, the low cut-off frequency is chosen as being the "offset" frequency ($f_{offset}$ in FIG. 7) for which approximately 66% of the phase noise is contained within the frequency range between 0 to $f_{offset}$ which is, for example, equal to approximately 100 kHz.

On the embodiment in FIG. 6, the determination of the locking or not of the ILO 104 on a multiple of the frequency f1 is, for example, carried out by a comparator 128 including a first input receiving the output signal of the integrator filter 126, and a second input to which is applied the threshold value with which the output signal of the integrator filter 126 is compared (in FIG. 6, said second input is connected to the earth).

The output of the comparator 128 is connected to the input of a control system 130 that determines whether a change of the adjustment of the ILO 104 is required. Such a change may correspond to an offset of the self-oscillation frequency of the ILO 104 that may be obtained by changing certain control parameters of the ILO 104 (for example, the values of variable capacities or inductances of the ILO 104), or by changing an internal polarisation voltage or power supply voltage of the ILO 104. For example, when the ILO 104 comprises a resonant circuit and a negative resistance circuit (for example, an LC oscillator or a Colpitts oscillator) or a relaxation oscillator using delays produced by the RC circuits, it is possible to vary a variable capacity of the oscillator in order to adjust the self-oscillation frequency of the ILO 104. If the ILO 104 comprises a ring oscillator made of asymmetric or differential inverter circuits, the self-oscillation frequency of the ILO 104 may be changed by changing the polarisation or power supply voltage of the inverter circuits forming the ring oscillator.

It is possible that the control system 130 implements a search algorithm wherein the self-oscillation frequency of the ILO 104 is changed progressively in the aim of reducing the output signal of the integrator filter 126. Such an algorithm may be implemented digitally if the output of the comparator 128 is used as a binary indicator of the locking of the ILO 104. Said algorithm may also be implemented analogically by directly using the output of the integrator filter 126 and by using a relation connecting said output signal to the difference between the self-oscillation frequency and the desired frequency of the ILO 104. Such a control system 130 notably makes it possible to obtain a locking of the ILO 104 at the centre of a locking frequency range, which makes it possible to have a minimum phase noise.

Figure 8:
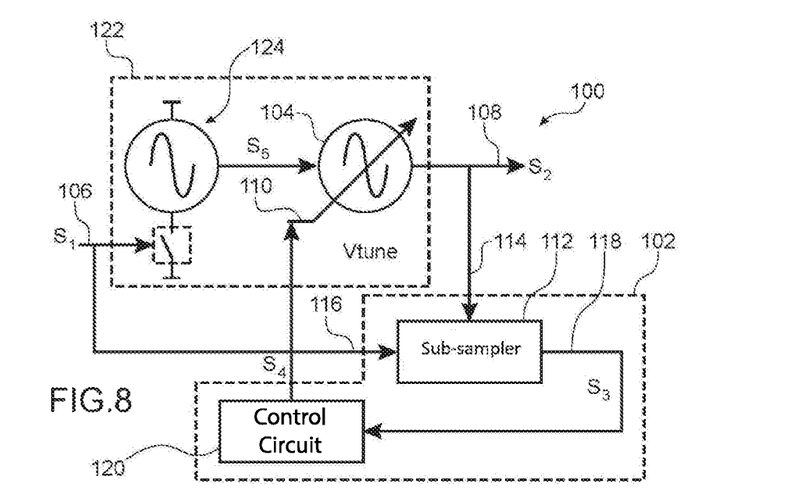
FIG. 8 shows a frequency multiplication device including a device for adjusting the injection locking of a frequency multiplier, according to a second embodiment.

FIG. 8 that schematically shows a frequency multiplication device 100 including a device 102 for adjusting the injection locking of a frequency multiplier of the device 100, according to a second embodiment.

In said second embodiment, the ILO 104 forms part of a frequency multiplier 122 including a generator of periodically repeated oscillation train, or PROT, type signal. Said multiplier 122 makes it possible to carry out a frequency multiplication that is stabilised in frequency and in noise. The frequency multiplier 122 comprises elements 124 carrying out a generation of a PROT signal. Said elements 124 receive as input the periodic signal S1 and generate a signal S5 corresponding to oscillations train of frequency substantially equal to N·f1, of duration less than $T_1$=1/f1 and repeated periodically at the frequency f1, with N integer number greater than 1. The elements 124 may be seen as applying a first multiplication factor N to the signal S1 because the signal S5 comprises in the spectrum thereof a main line at the frequency N·f1.

From said signal S5, the ILO 104 generates the periodic signal S2 the frequency spectrum of which comprises a main line of frequency f2=(N+i)·f1, with i integer number, by playing a role of pass-band filter applied to the signal S5 and rejecting from the frequency spectrum of said periodic signal the lines other than one of the lines of the signal S5. The ILO 104 is used to recover in the spectrum of the signal S5 the desired line and generates as output the periodic signal S2, for example, sinusoidal, stable of frequency f1=(N+i)·f1. The "i" corresponds to the multiplication factor provided by the ILO 104.

Details concerning the operation and the embodiment of such a frequency multiplier 122 are given in document WO 2013/079685 A1.

Regardless of the embodiment of the device 100, the adjustment device 102 is advantageously used for generating signals the frequencies of which belong to the millimetre-wave band, for example between approximately 20 GHz and 300 GHz. In this case, the value of the frequency f1 is, for example, between approximately 1 GHz and 10 GHz.

In the two embodiments previously described, the signal S4 generated as output of the device 102 corresponds to a feedback signal used for adjusting the setting of the free oscillation frequency of the ILO 104 and therefore same of the frequency on which the ILO 104 is locked. Alternatively, it is possible that the signal S4 is not used as a feedback signal but corresponds to a signal providing the user of the device 100 with information about the locking or not of the frequency multiplier on a multiple of the frequency f1. For example, the control circuit 120 may be configured for outputting a signal S4 the amplitude of which has a first value when the injection locked frequency multiplier is locked on a frequency corresponding to a multiple of the frequency f1, and a second value, different from the first value, when the injection locked frequency multiplier is not locked on a frequency corresponding to a multiple of the frequency f1.

The invention claimed is:

1. Device for adjusting the locking of an injection locked frequency multiplier, including at least:
one first input configured for receiving a first signal of frequency f1 intended to be applied as input of the injection locked frequency multiplier, and a second input configured for receiving a second signal of frequency f2 intended to be outputted by the injection locked frequency multiplier;
one sub-sampler configured for carrying out a sub-sampling of the second signal by the first signal or by another signal of frequency $f_S$ equal to an integer multiple of the frequency f1 and less than the frequency f2;
one control circuit configured for:
receiving as input a third signal obtained as output of the sub-sampler and corresponding to the second signal sub-sampled by the first signal or by the signal of frequency $f_S$, then
determining that the injection locked frequency multiplier is locked on a frequency equal to a multiple of the frequency f1 when the third signal is continuous and when the injection locked frequency multiplier is not locked on a frequency equal to a multiple of the frequency f1 when the third signal varies over time, then
outputting a fourth signal the value of which is representative of the locking or not of the injection locked frequency multiplier on a frequency corresponding to a multiple of the frequency f1;
and wherein the control circuit comprises an integrator filter configured for carrying out a high-pass or pass-band filtering of the third signal, the injection locked frequency multiplier being considered as locked on a frequency corresponding to a multiple of the frequency f1 when the signal obtained by said high-pass or pass-band filtering is substantially zero.

2. Device according to claim 1, wherein the output of the control circuit is configured for being connected to a control input of the injection locked frequency multiplier, the device being configured for forming a feedback loop for the locking of the injection locked frequency multiplier on a frequency corresponding to a multiple of the frequency f1.

3. Device according to claim 1, wherein the integrator filter is configured for carrying out a pass-band filtering of the third signal with a high cut-off frequency equal to approximately (f1)/2.

4. Device according to claim 1, wherein the control circuit further comprises a comparator configured for comparing an output signal of the integrator filter with a threshold value, and a control system configured for changing or not at least one parameter of the injection locked frequency multiplier according to a value of an output signal of the comparator.

5. Frequency multiplication device, including at least:
one injection locked frequency multiplier;
one adjustment device according to claim 1, the second input of which is coupled to an output of the injection locked frequency multiplier.

6. Device according to claim 5, wherein the value of the f2/f1 ratio is between approximately 20 and 35.

7. Device according to claim 5, wherein the injection locked frequency multiplier comprises at least one injection-locked oscillator, ILO.

8. Device according to claim 7, wherein the injection locked frequency multiplier further comprises a periodically repeated oscillation train generator configured for receiving as input the first signal and for generating as output a fifth signal corresponding to oscillations train of frequency substantially equal to N·f1, of duration less than T1=1/f1 and repeated periodically at the frequency f1, with N integer number greater than 1, and the output of which is coupled to the input of the ILO.

9. Device according to claim 7, wherein an injection input of the ILO is configured for receiving the first signal.

10. Device according to claim 7, wherein:
a control input of the ILO is coupled to the output of the control circuit;
the control circuit is configured for changing the value of the fourth signal until the injection locked frequency multiplier is locked on a frequency corresponding to a multiple of the frequency f1.

11. Method for adjusting the locking of an injection locked frequency multiplier, including at least:
generation, by the injection locked frequency multiplier and from a first signal of frequency f1, of a second signal of frequency f2;
generation of a third signal corresponding to the second signal sub-sampled by the first signal or by another signal of frequency $f_S$ equal to an integer multiple of the frequency f1 and less than the frequency f2;
high-pass or pass-band filtering of the third signal;
determination that the injection locked frequency multiplier is locked on a frequency equal to a multiple of the frequency f1 when the signal obtained by said high-pass or pass-band filtering is substantially zero;
generation of a fourth signal the value of which is representative of the locking or not of the injection locked frequency multiplier on a frequency corresponding to a multiple of the frequency f1.

* * * * *